Nov. 7, 1967 P. C. NEWMAN 3,351,827

OPTO-ELECTRONIC SEMICONDUCTOR WITH IMPROVED EMITTER-REGION

Filed Aug. 13, 1965 2 Sheets-Sheet 1

INVENTOR.
PETER C. NEWMAN
BY
Frank R. Trifari
AGENT

Nov. 7, 1967 P. C. NEWMAN 3,351,827

OPTO-ELECTRONIC SEMICONDUCTOR WITH IMPROVED EMITTER-REGION

Filed Aug. 13, 1965 2 Sheets-Sheet 2

INVENTOR.
PETER C. NEWMAN
BY Frank R. Jifani
AGENT

United States Patent Office 3,351,827

Patented Nov. 7, 1967

3,351,827

OPTO-ELECTRONIC SEMICONDUCTOR WITH IMPROVED EMITTER-REGION

Peter Colin Newman, Crawley, Sussex, England, assignor to North American Philips Company, Inc., New York, N.Y., a corporation of Delaware Filed Aug. 13, 1965, Ser. No. 479,402
Claims priority, application Great Britain, Aug. 19, 1964, 33,878/64
6 Claims. (Cl. 317—235)

ABSTRACT OF THE DISCLOSURE

An opto-electronic transistor exhibiting improved efficiency as a result of reducing the concentration of the major conductivity type determining impurities in the emitter region at its surface in order to reduce the absorption of photons in the emitter region.

This invention relates to opto-electronic semiconductor devices. In co-pending patent application Ser. No. 336,336, filed Dec. 19, 1963 (now abandoned), whose contents are hereby incorporated by reference, there is described and claimed an opto-electronic semiconductor device comprising a semiconductor body having a first photon-emissive p-n junction capable of emitting photons with a quantum efficiency greater than 0.1 when suitably biased in the forward direction and a photo-sensitive part comprising a second photo-sensitive p-n junction for transforming the energy of photons emanating from the first p-n junction to that of charge carriers when the second p-n junction is suitably biased in the reverse direction, the distance between the first p-n junction and the second p-n junction being at least one diffusion length from the first p-n junction of the charge carriers injected by that junction into the adjacent region of the body intermediate the first and second junctions. Such a device will hereinafter be referred to as an opto-electronic transistor. The regions of the body will be given the terms normally associated therewith in the transistor art. Thus, the region of the body intermediate the first and second junctions will be hereinafter referred to as the base region. The first junction will hereinafter be referred to as the emitter-base junction separating the base region from the emitter region and the second junction will be hereinafter referred to as the collector-base junction separating the base region from the collector region. The copending patent application mentions germanium, silicon and $A_{III}$–$B_V$ compounds as materials suitable for the semiconductor body.

An opto-electronic transistor may generally have a pnp or npn structure with a single connection to the region of the body intermediate the first and second junctions, but in certain instances the structure may be such that more than one connection is made to the region of the body intermediate the first and second junctions, for example, when the intermediate region comprises a high resistivity part serving to electrically isolate the junctions. The principle of small signal operation of a pnp opto-electronic transistor is as follows:

The emitter-base junction is forward biased to obtain a region of excess carrier concentration each side of this junction. The semiconductor material and impurity content are chosen such that a large proportion of the hole-electron pairs recombine with the emission of photons.

The collector-base junction is reverse biased to obtain a depletion region. Hole-electron pairs are liberated in the depletion region by the photons emitted from the first junction which reach the depletion region and the hole-electron pairs are rapidly separated by the field, the holes flowing to the collector and the electrons to the base.

The input signal modulates the emitter-base current. This change in current produces a change in the number of photons emitted. The change in collector-base current follows the change in emitter-base current and the $\alpha_0$ of the opto-electronic transistor may approach unity if certain conditions are satisfied. One such condition is that most of the photons emitted should reach the depletion region of the collector-base junction and be absorbed therein and converted into current with a quantum efficiency approaching unity.

The emitter region may be formed by diffusion in the semi-conductor body of a suitable conductivity type determining impurity, for example, if the emitter and base regions are of gallium arsenide a p-type emitter region may be suitably formed by diffusion of an acceptor such as zinc or cadmium into an n-type base region initially uniformly doped with a donor such as tin or tellurium. Using normal diffusion techniques the acceptor concentration at the surface of the emitter region will lie in the range $10^{19}$ to $10^{20}$ atoms/cc.

The effective angular distribution of photons generated in the vicinity of the emitter-base junction should preferably be adjusted to direct most of the photons towards the collector base junction. The effective angular distribution is determined by the initial distribution of photons from the emission region and by reflection and refraction. To obtain an $\alpha_0$ approaching unity, for example 0.95, less than about 1% of the emitted photons can be allowed to escape from the semiconductor body. To achieve this it has been found necessary in certain instances to deposit a reflective coating on the surface of the body. Thus, for example, a p-type diffused emitter region may have a reflective coating on its surface. Any emitted photons reaching the surface and reflected by this coating which are to contribute to the generation of electron-hole pairs on absorption at the collector-base junction will have to travel twice through the emitter region and therefore it is important that absorption shall be low in this region.

According to the invention in an opto-electronic transistor in part of the emitter region the major concentration of the conductivity type determining impurity element or elements is less than the concentration which would apply if the element or elements is or are introduced into the semiconductor body by diffusion into the semi-conductor body from the surface of the emitter region.

This arrangement has the advantage, inter alia, that as absorption of the emitted photons increases with increasing impurity concentration, the lowering of the concentration in the part of the emitter region leads to a reduction in the absorption of photons in the emitter region. This advantage is particularly, but not exclusively, relevant when the emitter surface has a reflective coating since an increase in the number of those photons which are reflected by this coating travelling twice across the emitter region without absorption and contributing to the output on reaching the collector-base junction occurs.

The major concentration of the conductivity type determining impurity element or elements at the surface of the emitter region may be less than the concentration at some other part of the region.

In a preferred form of the invention the major concentration of the conductivity type determining impurity element or elements in the emitter region has been provided by the in diffusion of the element or elements into the surface of the region followed by the out diffusion of the element or elements from the surface of the region. The method of out diffusion is employed to lower the concentration of the previously diffused element or elements and such out diffusion will lower the surface concentration.

The term major concentration of the conductivity type determining impurity element or elements is used in the sense that the emitter region may also contain a further lower concentration of an impurity element or elements characteristic of the same conductivity type and introduced into the region separately from the major concentration, for example, when the emitter region is an epitaxial region and the major concentration is provided by in and out diffusion there may be initially present in the epitaxial material a substantially uniform low background concentration of an impurity element characteristic of the same conductivity type as the major concentration of the conductivity type determining impurity element or elements subsequently provided in the emitter region.

The emitter region may be of a III–V semiconductor compound, for example, gallium arsenide, or a substituted III–V semiconductor compound, for example, gallium arseno phosphide ($GaAs_{1-x}P_x$).

Reference herein to a III–V semiconductor compound is to be understood to mean a compound between substantially equal atomic amounts of an element of the class consisting of boron, aluminum, gallium and indium of Group III of the Periodic Table and an element of the class consisting of nitrogen, phosphorous, arsenic and antimony of Group V of the Periodic Table. Reference to a substituted III–V semiconductor compound is to be understood to mean a III–V semiconductor compound in which some of the atoms of the element of the above class of Group III are replaced by atoms of another element or other elements of the same class and/or some of the atoms of the element of the above class of Group V are replaced by atoms of another element or other elements of the same class.

The emitter region may be of a substituted III–V semiconductor compound of varying composition such that the energy gap of the semiconductor material decreases across the emitter region in the direction from the surface of the emitter region towards the emitter-base junction. This permits a further reduction of the absorption of photons in the emitter region since the absorption length of the emitter photons increases with increasing energy gap of the material in which they travel.

When the emitter region is of a III–V semiconductor compound or a substituted III–V semiconductor compound the major concentration of the conductivity type determining impurity element in the emitter region may be, for example, of zinc or cadmium. In the case of zinc, the concentration at the surface of the emitter region may be less than $10^{18}$ atoms/cc.

One embodiment of the invention will now be described, by way of example, with reference to the diagrammatic drawings accompanying the specification, in which.

Figure 1:
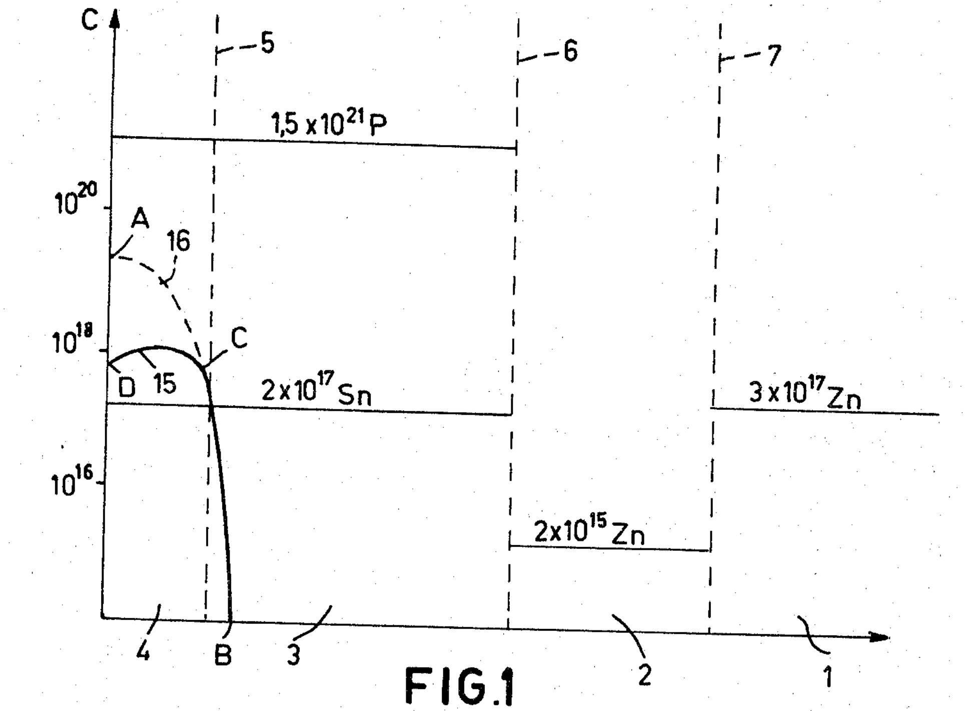
FIGURE 1 is a graph showing the concentration of impurity centres in the semiconductor body of an opto-electronic transistor according to the invention.

In FIGURE 1 the impurity concentrations C are represented as ordinates on a logarithmic scale and the distances S in the semiconductor body are represented as abscissae on a linear scale.

Figure 2:
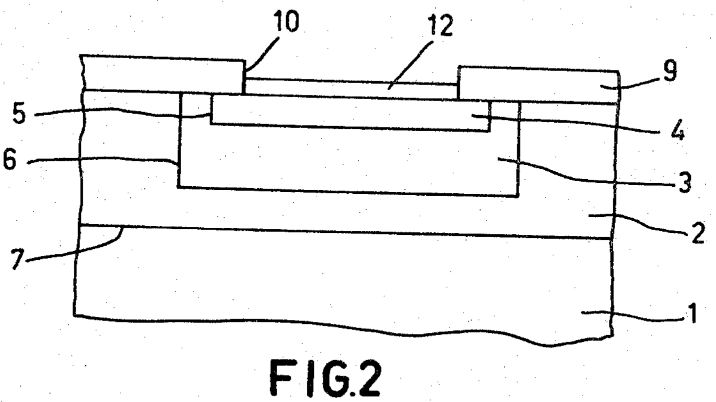
FIGURE 2 is a section through part of the opto-electronic transistor of FIGURE 1 during a stage of manufacture prior to attachment of leads to the various regions of the semiconductor body.
Figure 3:
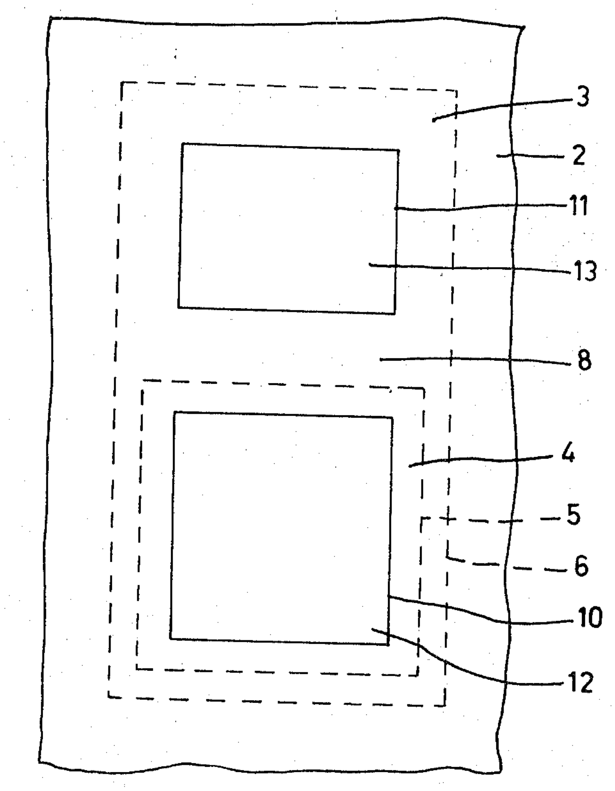
FIGURE 3 is a plan view of the opto-electronic transistor part shown in FIGURE 2.

The opto-electronic transistor of FIGURES 1 to 3 consists of a semiconductor body having a low resistivity single crystals p+ substrate 1 of gallium arsenide with a uniform acceptor concentration of zinc of about $3\times10^{17}$ atoms/cc., a higher resistivity p-type collector region 2 of gallium arsenide epitaxially deposited on the substrate 1 and having a uniform acceptor concentration of zinc of $2\times10^{15}$ atoms/cc., an n-type base region 3 of gallium arseno phosphide having a uniform donor concentration of tin of $2\times10^{17}$ atoms/cc., a p-type emitter region 4 of gallium arseno phosphide having an acceptor concentration of zinc as shown by the full line 15 in FIGURE 1, the concentration increasing from about $5\times10^{17}$ atoms/cc., at the surface of the emitter region to a maximum of about $10^{18}$ atoms/cc. and then decreasing towards the emitter-base junction 5 where the concentration is $2\times10^{17}$ atoms/cc., and a collector-base junction 6. The p-n junctions 5 and 6 are represented in FIGURES 1 and 3 by broken lines and the interface between the substrate 1 and the region 2 is represented by a broken line 7 in FIGURE 1.

The base region 3 consists of gallium arseno phosphide having a uniform concentration of phosphorus of $1.5\times10^{21}$ atoms/cc. epitaxially deposited in a cavity 8 (FIGURE 3) formed in the epitaxially deposited collector region 2 of gallium arsenide and the emitter region 4 is formed by the initial diffusion of zinc into the epitaxially deposited gallium arseno phosphide to give a concentration shown by the curve AB of FIGURE 1 and to form the emitter-base junction 5, later followed by out diffusion of the zinc to give a concentration in the emitter region shown by the curve DCB. The emitter-base junction and the collector-base junction both terminate only in the common plane surface of the regions 2, 3 and 4 of the body and the emitter-base junction is surrounded by the collector-base junction within the semiconductor body. The dimensions of the p+ gallium arsenide substrate are 1 mm. x 1 mm. x 0.3 mm. thickness, the epitaxially deposited collector region 2 has a thickness of about 30$\mu$, the collector base junction 6 corresponds to the extremity of the cavity 8 formed in the region 2 and has a depth in the region of about 20$\mu$ and the emitter-base junction 5 is at a depth of 5$\mu$ within the epitaxially deposited gallium arseno phosphide. The area of the major part of the collector-base junction lying parallel to the interface 7 between the collector-region 2 and the substrate 1 and parallel to the common plane surface of the regions 2, 3 and 4 in which both junctions terminate is 110$\mu$ x 60$\mu$ and the corresponding area of the emitter-base junction is 50$\mu$ x 50$\mu$. The upper common plane surface of the body in which the junctions terminate has an insulating masking layer of silicon oxide 9 deposited thereon with two windows 10 and 11 in the layer 9 in which ohmic contacts 12 and 13 to the emitter and base regions respectively are situated.

The opto-electronic transistor shown in FIGURES 1 to 3 is manufactured as follows:

A body of low resistivity gallium arsenide having zinc as acceptor impurity in a concentration of about $3\times10^{17}$ atoms/cc. in the form of a slice 1 cm. x 1 cm. is lapped to a thickness of 0.3 mm. to form a substrate 1 and polished so that it has a damage free crystal structure and an optically flat finish on one of its larger surfaces. The starting material being a slice of 1 cm.$^2$ will yield a plurality of the described devices by carrying out subsequent steps in the manufacture using suitable masks such that a plurality of isolated devices are formed in the single slice which are later separated by dicing but the method will now be described with reference to the formation of each isolated device it being assumed that where masking, diffusion, etching and associated steps are referred to then these steps are simultaneously carried out for each isolated device on the single slice prior to dicing.

A layer of p-type gallium arsenide of 30$\mu$ thickness is epitaxially grown by deposition from the vapour phase on the prepared surface of the substrate 1 to form a collector region 2. The gallium arsenide layer is formed at 750° C. by the reaction of gallium and arsenic, the gallium being produced by the disproportionation of gallium monochloride and the arsenic being produced by the reduction of arsenic trichloride with hydrogen. Simultaneously with the deposition of the gallium arsenide zinc is deposited such that in the epitaxially grown layer there is a uniform concentration of zinc of $2\times10^{15}$ atoms/cc.

A masking layer of silicon oxide is now grown on the surface of the epitaxially deposited gallium arsenide by the reaction of dry oxygen and tetra-ethyl silicate at a temperature of 350–450° C. The slice is laid horizontally on a pedestal so that no silicon oxide is deposited on the lower surface of the low resistivity substrate.

A photo-sensitive resist layer is applied to the surface of the silicon oxide masking layer and with the aid of a mask is exposed such that an area of 110μ x 60μ is shielded from the incident radiation. The unexposed part of the resist layer is removed with a developer so that a window 110μ x 60μ is formed in the resist layer. The underlying oxide layer exposed by the window is now etched with a fluid consisting of a solution of 25% ammonium fluoride and 3% hydrofluoric acid in water. Etching is carried out until a window 110μ x 60μ is formed in the oxide masking layer. The photosensitive resist layer is then removed from the remainder of the surface of the oxide layer by softening in trichlorethylene and rubbing. Suitable resist material and developers are known and available commercially.

The body is now etched so that a cavity is formed in the epitaxially deposited gallium arsenide layer 2 at a position corresponding to the window in the oxide layer. Etching is continued until a cavity 8 of 20μ depth in the epitaxially deposited p-type layer is formed. A suitable etchant is 3 parts concentrated $HNO_3$, 2 parts $H_2O$ and 1 part HF (40%) used at 40° C., the etching rate being approximately 1 μ/sec. The oxide masking layer is subsequently removed by dissolving in the above described solution of ammonium fluoride and hydrofluoric acid in water. The original surface of the epitaxially deposited gallium arsenide layer 2 now having the 20μ cavity therein is prepared for further epitaxial deposition by etching briefly in the nitric acid and hydrofluoric acid solution described above but used at room temperature.

The prepared body is placed in a tube and an n-type layer of gallium arseno phosphide is epitaxially grown on the surface of the previously grown epitaxial layer 2 of gallium arsenide. The gallium arseno phosphide layer is formed at 750° C. by the reaction of gallium with arsenic and phosphorous. The gallium is produced by the disproportionation of gallium monochloride and the arsenic and phosphorous are produced by the reduction of their trichlorides with hydrogen. The phosphorous content in the epitaxially grown solid solution gallium arseno phosphide layer is $1.5 \times 10^{21}$ atoms/cc. Simultaneous with the deposition of the gallium arseno phosphide tin is deposited such that in the epitaxially grown layer there is a uniform concentration of tin of $2 \times 10^{17}$ atoms/cc. The epitaxial layer grown follows the contour of the surface and growth is continued until the layer is of such a thickness that the epitaxially grown layer of gallium arseno phosphide fills the cavity and extends over the region of the cavity a few microns beyond the original surface of the epitaxially deposited gallium arsenide layer 2.

After the epitaxial deposition, the body is removed from the tube and a metal disc coated with dental wax is placed in contact with the reverse side of the body. Material is removed from the exposed surface of the body consisting of the epitaxially deposited layer of gallium arseno phosphide by polishing until the surface becomes flat and lies a few microns below the original surface of the epitaxially grown layer 2 of gallium arsenide. By the use of suitable staining techniques the original surface of the epitaxially grown layer 2 of gallium arsenide may be located and the polishing halted thereafter accordingly. By this removal of the gallium arseno phosphide layer there remains a body as is shown in FIGURES 2 and 3 consisting of a $p^+$ substrate having a p-type epitaxial layer 2 of nearly 30μ thickness with a cavity 8 extending nearly 20μ from the upper surface into this layer and containing gallium arseno phosphide 3 epitaxially grown on the gallium arsenide. The interface 6 between the gallium arseno phosphide and the gallium arsenide corresponds to the extremity of the cavity 8 and will be the location of the collector-base junction of the opto-electronic transistor.

The surface of the body is given a light cleaning etch in a solution of methanol and bromine before a masking layer 9 of silicon oxide is grown on the prepared surface of the body by the reaction of dry oxygen and tetra-ethyl silicate at a temperature of 350–450° C. The body is laid horizontally on a pedestal so that no oxide is deposited on the lower surface.

A photosensitive resist layer is applied to the surface of the silicon oxide masking layer 9 and with the aid of a mask is exposed such that an area situated above the gallium arseno phosphide epitaxially deposited in the cavity and of dimensions 40μ x 40μ is shielded from the incident radiation. The unexposed part of the layer is removed with a developer so that a window 40μ x 40μ is formed in the resist layer. The body is etched to form a window 10 (FIGURE 3) 40μ x 40μ in the silicon oxide masking layer 9 at a position below the window in the resist layer. The etchant is the ammonium fluoride and hydrofluoric acid solution described above for removing the previously formed silicon oxide masking layer.

The photoresist remaining on the surface of the silicon oxide masking layer 9 is removed by softening in trichlorethylene and rubbing. The body is now placed in a sealed silica tube containing zinc and excess arsenic and phosphorous, and zinc is diffused into the gallium arseno phosphide region 3 by heating the tube to 900–1000° C.

The diffusion of zinc is controlled such that a concentration is obtained as is shown by the part broken and part full line ACB with the emitter base junction of the opto-electronic transistor lying at a distance of 5μ from the surface of the region 3 where the concentration, at the point A in the curve, is $3 \times 10^{19}$ atoms/cc.

The body is removed from the tube and sealed in a further silica tube with excess arsenic and phosphorus but with no zinc present and then heated to 1000° C. to out diffuse the zinc through the window 10 and finally obtain a concentration as shown by the full line DCB. The heating perior for the out diffusion may be longer than that required for the in diffusion of zinc and may typically be from 10 minutes to 1 hour.

Ohmic contact to the p-type emitter region is made by evaporating gold containing 4% zinc over the entire upper surface of the body. The source is held at 800–1000° C., the body at room temperature and the evaporation is continued for not more than 1 minute, so that a gold 4% zinc contact layer 12 is deposited on the emitter surface in the window 10.

The amount of gold/zinc evaporated over the upper surface is such as to be insufficient to fill the window 10 and the filling is thereafter affected with a protective lacquer of Cerric Resist. The remainder of the gold/zinc on the upper surface of the body is now removed by a solution of 40 g. KI, 10 g. I and 250 g. $H_2O$.

A fresh photosensitive resist layer is applied to the surface and, with the aid of a mask, exposed such that a second area 40μ x 30μ situated above the gallium arseno phosphide epitaxially deposited in the cavity is shielded from the incident radiation. The unexposed part of the photosensitive resist layer is removed so that a further window 40μ x 30μ is formed in the resist layer. The body is etched to form a window 11 (FIGURE 3) 40μ x 30μ in the silicon oxide masking layer 9 at a position below the window formed in the resist layer. The same etchant is used as is used to form the window 10 in the silicon oxide masking layer. The lacquer of Cerric Resist in the window 10 above the evaporated gold/zinc contact is not attacked by the etchant. The window 11 exposes the base region 4 of gallium arseno phosphide and ohmic contact to this region is made by evaporating gold containing 4% tin over the whole upper surface of the body so that a gold 4% tin contact layer 13 is deposited in the window 11 in the silicon oxide layer. The amount of gold/tin evaporated over the upper surface is such to be insufficient to fill the window 11 and the filling is thereafter effected with a protective lacquer of Cerric Resist. The remainder of this gold/tin layer on the upper surface of the body is removed with the exposed portion of the photosensitive resist layer, by softening this in trichlorethylene and rubbing.

The protective lacquer of Cerric Resist in the windows 10 and 11 above the gold/zinc and god/tin layers respectively is removed by dissolving in acetone.

The body is placed in a furnace and heated to 500° C. for 5 minutes to alloy the gold/zinc and gold/tin contact layers 12 and 13 respectively to the emitter and base regions respectively.

A reflective layer of gold (not shown in the figures) may now be selectively applied to the surface of the oxide layer to form a mirror at the periphery of the emitter-base junction. This may be carried out by applying a photosensitive resist layer to the entire surface and, with the aid of a mask, exposing the resist layer so that a narrow strip above the periphery of the emitter-base junction is shielded from the incident radiation. The unexposed part of the photosensitive resist layer is removed so that a window corresponding to the narrow strip is formed in the resist layer. Gold is then evaporated over the entire upper surface of the body so that in the window formed in the reist layer a reflective gold layer is deposited on the silicon oxide layer. The evaporated gold on the remainder of the surface is then removed with the exposed portion of the photosensitive resist layer by softening this in trichlorethylene and rubbing.

The slice is now diced up into individual pieces 1 mm. x 1 mm. each comprising an opto-electronic transistor assembly. A molybdenum strip is soldered to be $p^+$ substrate with a bismuth 2% silver alloy or a bismuth 5% cadmium alloy.

Leads are then secured to the gold and tin contacts 12 and 13 to the emitter and base regions respectively by thermo-compression bonding gold wires thereto. The assembly with leads so attached is then given a final etch in a fluid of 3 parts concentrated $HNO_3$, A parts $H_2O$ and 1 part HF (40%) used at room temperature. The assembly is then encapsulated as is desired.

What is claimed is:

1. An opto-electronic transistor formed of a monocrystalline semiconductive material, said transistor having a base region of one conductivity type, an emitter region of the other conductivity type forming with said base region a charge carrier-to-photon conversion p-n junction for emitting photons into said base region, and a collector region of the other conductivity type forming a photon-to-charge carrier conversion p-n junction with said base region for collecting photons from said base region, said p-n junctions being spaced apart by at least one diffusion length for charge carriers, and said emitter region having major conductivity type determining impurities in a progressively increasing concentration from the surface thereof to an area located at a depth less than the depth of said emitter-base junction.

2. An opto-electronic transistor as set forth in claim 1 wherein a reflective coating is provided on the surface of the emitter region.

3. An opto-electronic transistor as set forth in claim 1 wherein the semiconductive material is a compound of an element selected from the group consisting of nitrogen, phosphorus, arsenic, antimony and mixtures thereof and an element selected from the group consisting of boron, aluminum, gallium, indium and mixtures thereof.

4. An opto-electronic transistor as set forth in claim 3 wherein the emitter region is of gallium arsenide.

5. An opto-electronic transistor as set forth in claim 3 wherein the emitter region is of gallium arseno phosphide $GaAs_{1-x}P_x$.

6. An opto-electronic transistor as set forth in claim 3 wherein zinc is the major conductivity determining impurity in the emitter region, and the zinc concentration at the surface of the emitter region is less than $10^{18}$ atoms/cc.

References Cited

UNITED STATES PATENTS

| | | | |
|---|---|---|---|
| 3,043,958 | 7/1962 | Diemer | 317—235 |
| 3,102,201 | 8/1963 | Braunstein et al. | 317—235 |
| 3,200,259 | 8/1965 | Braunstein | 317—235 |

OTHER REFERENCES

Proceedings of the IRE, Aug. 1962, pp. 1822–1823.

JAMES D. KALLAM, *Primary Examiner.*